US006822926B2

(12) United States Patent
Kanai et al.

(10) Patent No.: US 6,822,926 B2
(45) Date of Patent: Nov. 23, 2004

(54) NON-VOLATILE SEMICONDUCTOR MEMORY DEVICE

(75) Inventors: Masahiro Kanai, Suwa (JP); Teruhiko Kamei, Yokohama (JP)

(73) Assignee: Seiko Epson Corporation, Tokyo (JP)

( * ) Notice: Subject to any disclaimer, the term of this patent is extended or adjusted under 35 U.S.C. 154(b) by 16 days.

(21) Appl. No.: 10/197,643

(22) Filed: Jul. 18, 2002

(65) Prior Publication Data

US 2003/0025150 A1 Feb. 6, 2003

(30) Foreign Application Priority Data

Jul. 23, 2001 (JP) ........................................ 2001-221786

(51) Int. Cl.[7] ..................... H10L 29/788; H10L 29/792; G11C 7/00
(52) U.S. Cl. ...................... 365/315; 257/314; 257/316; 257/324; 365/200
(58) Field of Search ................................ 257/314–324; 365/185, 200

(56) References Cited

U.S. PATENT DOCUMENTS

| | | | |
|---|---|---|---|
| 5,126,808 A | | 6/1992 | Montalvo et al. |
| 5,408,115 A | | 4/1995 | Chang |
| 5,422,504 A | | 6/1995 | Chang et al. |
| 5,494,838 A | | 2/1996 | Chang et al. |
| 5,909,405 A | * | 6/1999 | Lee et al. ............... 365/230.03 |
| 5,969,383 A | | 10/1999 | Chang et al. |
| 6,133,098 A | * | 10/2000 | Ogura et al. ................. 438/267 |
| 6,177,318 B1 | | 1/2001 | Ogura et al. |
| 6,248,633 B1 | | 6/2001 | Ogura et al. |
| 6,255,166 B1 | | 7/2001 | Ogura et al. |
| 6,359,807 B1 | * | 3/2002 | Ogura et al. ............ 365/185.18 |
| 6,380,636 B1 | * | 4/2002 | Tatsukawa et al. .......... 257/390 |
| 6,542,412 B2 | * | 4/2003 | Ogura et al. ............ 365/185.33 |

FOREIGN PATENT DOCUMENTS

| | | |
|---|---|---|
| JP | A 63-193400 | 8/1988 |
| JP | A 63268194 | 11/1988 |
| JP | A 63-268195 | 11/1988 |
| JP | A 64-5072 | 1/1989 |
| JP | A07-161851 | 6/1995 |
| JP | B1 2978477 | 11/1999 |
| JP | A 2001-156188 | 6/2001 |

OTHER PUBLICATIONS

U.S. patent application Ser. No. 09/955,158, Kanai et al., filed Sep. 19, 2001.
U.S patent application Ser. No. 09/955,160, Kanai et al., filed Sep. 19, 2001.
U.S. patent application Ser. No. 10/115,913, Kamei et al., filed Apr. 5, 2002.
U.S. patent application Ser. No. 10/115,956, Kamei et al., filed Apr. 5, 2002.

(List continued on next page.)

Primary Examiner—Minhloan Tran
Assistant Examiner—Johannes Mondt
(74) Attorney, Agent, or Firm—Oliff & Berridge, PLC

(57) ABSTRACT

A non-volatile semiconductor memory device having a memory cell array region in which a plurality of memory cells, each having first and second MONOS memory cells controlled by a word gate and control gates, are arranged in first and second directions. The memory cell array region has a plurality of sector regions divided in the second direction. Each of a plurality of control gate drivers is capable of setting a potential of first and second control gates in the corresponding sector region independently of other sector regions. A plurality of switching elements which select connection/disconnection are formed at connections between a plurality of main bit lines and a plurality of sub bit lines.

6 Claims, 15 Drawing Sheets

OTHER PUBLICATIONS

U.S. patent application Ser. No. 10/153,611, Owa, filed May 24, 2002.

U.S. patent application Ser. No. 10/153,686, Owa, filed May 24, 2002.

U.S. patent application Ser. No. 10/153,736, Owa, filed May 24, 2002.

U.S. patent application Ser. No. 10/157,897, Kamei et al., filed May 31, 2002.

U.S. patent application Ser. No. 10/157,896, Kamei et al., filed May 31, 2002.

U.S. patent application Ser. No. 10/197,668, Kanai, filed Jul. 18, 2002.

U.S. patent application Ser. No. 10/197,644, Kamei, filed Jul. 18, 2002.

U.S. patent application Ser. No. 10/197,646, Kanai, filed Jul. 18, 2002.

U.S. patent application Ser. No. 10/197,645, Natori, filed Jul. 18, 2002.

Hayashi et al., "Twin MONOS Cell with Dual Control Gates", 2000, IEEE VLSI Technology Digest.

Chang et al., "A New SONOS Memory Using Source–Side Injection for programming", IEEE Electron Device Letters, vol. 19, No. 7, Jul. 1998, pp. 253–255.

Chen et al., "A Novel Flash Memory Device with S Plit Gate Source Side Injection and O_O Charge Storage Stack (SPIN)" 1997, VLSI Technology Digest, pp. 63–34.

* cited by examiner

FIG. 7A
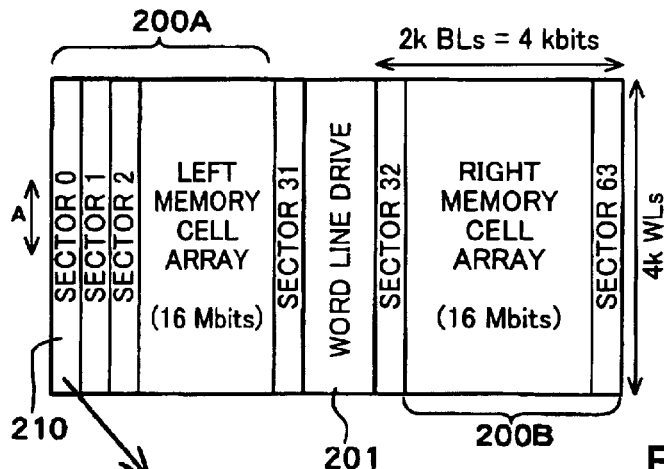
FIG. 7B
FIG. 7C
FIG. 7D
FIG. 7E
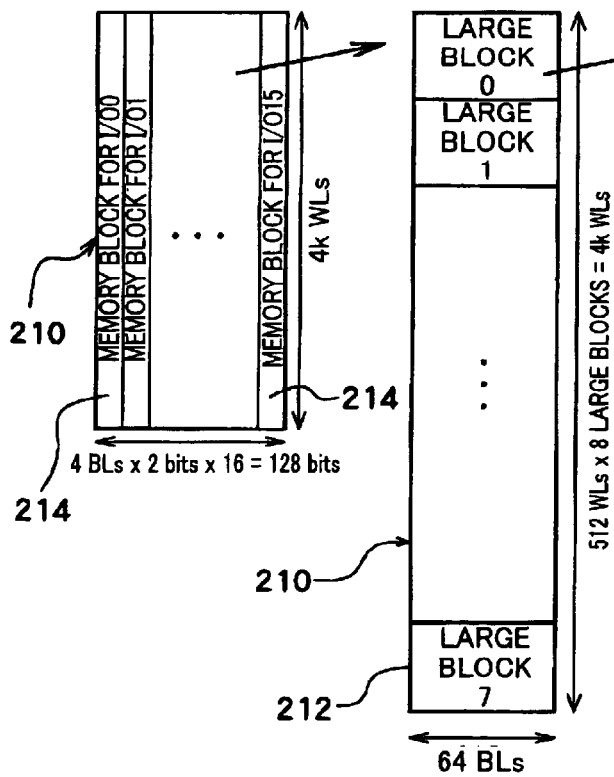
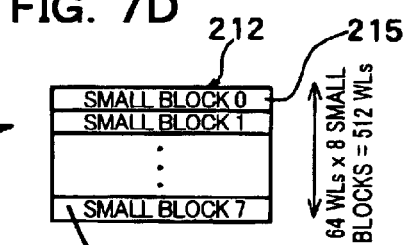
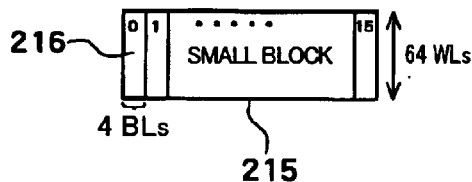

NON-VOLATILE SEMICONDUCTOR MEMORY DEVICE

Japanese Patent Application No. 2001-221786 filed on Jul. 23, 2001, is hereby incorporated by reference in its entirety.

BACKGROUND OF THE INVENTION

The present invention relates to a non-volatile semiconductor memory device including memory cells, each of the memory cells having two non-volatile memory elements and being controlled by one word gate and two control gates.

A known type of non-volatile semiconductor device is a metal-oxide-nitride-oxide semiconductor or substrate (MONOS), wherein a gate insulation layer between the channel and the gate is formed of a multi-layer stack of a silicon oxide film, a silicon nitride film, and a silicon oxide film, and charge is trapped in the silicon nitride film.

This MONOS type of non-volatile semiconductor memory device was disclosed by Y. Hayashi, et al, in 2000 Symposium on VLSI Technology Digest of Technical Papers, pp. 122–123. This document disclosed a twin MONOS flash memory cell provided with two non-volatile memory elements (MONOS memory cells) controlled by one word gate and two control gates. In other words, each flash memory cell has two charge-trapping sites. A plurality of MONOS flash memory cells of this configuration are arranged in both a row direction and a column direction, to form a memory cell array region.

Two bit lines, one word line, and two control gate lines are required for driving this MONOS flash memory cell. It should be noted, however, that these lines can be connected in common if different control gates are set to the same potential during the driving of a large number of memory cells.

In this case, a flash memory operation is data erasure, programming, or reading. Data programming and reading is usually done for selected cells for eight or 16 bits simultaneously, but data erasure is simultaneously done over a much wider range.

In such a case, data disturbance becomes a cause of concern with this type of non-volatile memory. Data disturbance refers to the disturbance of data in non-selected cells, during programming or erasure done by repeating a programming or erasure state in which a high potential is applied even to cells within the non-selected sector region by the common wiring, during programming or erasure in which a high potential is applied to the control gate line and bit line of the selected cells.

To prevent such a situation, the configuration could be such that a select gate circuit is provided to ensure that the high potential is applied only to control gates in cells in the selected sector, whereas no high potential is applied to control gates in cells in non-selected sector.

With such a configuration, however, if a voltage drop occurs in the select gates, it is necessary to supply an increased voltage to allow for that voltage drop, in order to supply a high potential to the control gates in cells in selected sectors during programming or erasure. As a result, low-voltage drive is impeded, making this unsuitable for equipment that demands a low power consumption, such as portable equipment in particular.

BRIEF SUMMARY OF THE INVENTION

The present invention may provide a non-volatile semiconductor memory device enabling high-speed access when reading/writing while preventing the disturbance of data in cells in non-selected sector during programming or erasure in selected cells.

The present invention may also provide a non-volatile semiconductor memory device capable of increasing the degree of integration of memory cells while enabling high-speed access at the time of reading/writing.

The present invention may further provide a non-volatile semiconductor memory device capable of reducing power consumption.

One aspect of the present invention provides a non-volatile semiconductor memory device comprising: a memory cell array region in which are disposed a plurality of memory cells in first and second directions intersecting each other, each of the memory cells having first and second non-volatile memory elements that are controlled by one word gate and first and second control gates; and a control gate drive section which drives the first and second control gates of the memory cells within the memory cell array region.

The memory cell array region is divided in the second direction into a plurality of sector regions.

The control gate drive section has a plurality of control gate drivers each of which corresponds to one of the sector regions. Each of the control gate drivers is capable of setting a potential for the first and second control gates within the corresponding sector region, independently of other sector regions.

Each of the sector regions is divided in the first direction into a plurality of block regions, and each of the block regions has a plurality of memory cells. Each of the block regions has a plurality of sub bit lines respectively connected to the memory cells and extending in the first direction. A plurality of main bit lines are provided over the plurality of block regions extending in the first direction, and each of the main bit lines is commonly connected to the sub bit lines within the block regions. A plurality of switching elements which select connection/disconnection are provided at connections between the main bit lines and the sub bit lines.

In this aspect of the invention, each of the plurality of control gate drivers is capable of setting the potential of the first and second control gates in the corresponding sector region independently of other sector regions. Therefore, when programming the selected cells in one of the sector regions, only the control gate potential of the memory cells (selected cells and non-selected cells) in this sector region can be set to a program or erasure potential by the corresponding control gate driver. Since the potential in other sector regions can be set to a potential other than the program or erasure potential by the corresponding control gate drivers, data is not disturbed in the cells in the non-selected sector regions. This eliminates the need for select gate circuits for applying a potential only to the control gates in the specific cells in the selected block, whereby the degree of integration of the memory cells can be increased. Moreover, since a voltage drop does not occur in the select gate circuit, low voltage driving can be achieved. Therefore, the non-volatile semiconductor memory device can be effectively utilized particularly as a memory for portable equipment.

In this aspect of the invention, a plurality of switching elements which select connection/disconnection are formed at the connections between the main bit lines and the sub bit lines. Therefore, a selected sub bit line and a main bit line connected thereto can be put in a conductive state, and a non-selected sub bit line and a main bit line connected thereto can be put in a non-conductive state, by the switching elements. As a result, since the wiring capacitance of the bit lines can be decreased at the time of reading/writing, the memory cells can be accessed at a higher speed at the time of reading/writing.

In this non-volatile semiconductor memory device, each of the switching elements may be provided at an end portion of each of the sub bit lines.

In each of the block regions, an odd-numbered switching element may be connected to an end portion of an odd-numbered sub bit line on one side, and an even-numbered switching element may be connected to an end portion of an even-numbered sub bit line on the opposite side, among the plurality of the sub bit lines.

In two of the block regions adjacent to each other in the first direction, when the switching elements in one block region are referred to as first switching elements and the switching elements in the other block region are referred to as second switching elements, the first and second switching elements commonly connected to one of the main bit lines may be disposed to be adjacent to each other. If the first and second switching elements are field effect transistors which share an impurity layer, impurity layers can be shared by the first and second switching elements, whereby the degree of integration of the memory cells can be improved.

BRIEF DESCRIPTION OF THE SEVERAL VIEWS OF THE DRAWING

FIG. 7A is a planar layout of the entire non-volatile semiconductor memory device shown in FIG. 1; FIG. 7B is a plan view of one sector region shown in FIG. 7A; FIG. 7C is a plan view of the sector region; FIG. 7D is a plan view of one large block shown in FIG. 7C; and FIG. 7E is a plan view of one small block shown in FIG. 7D.

DETAILED DESCRIPTION OF THE EMBODIMENT

An embodiment of the present invention is described below with reference to the drawings.

Memory Cell Configuration

Figure 1:
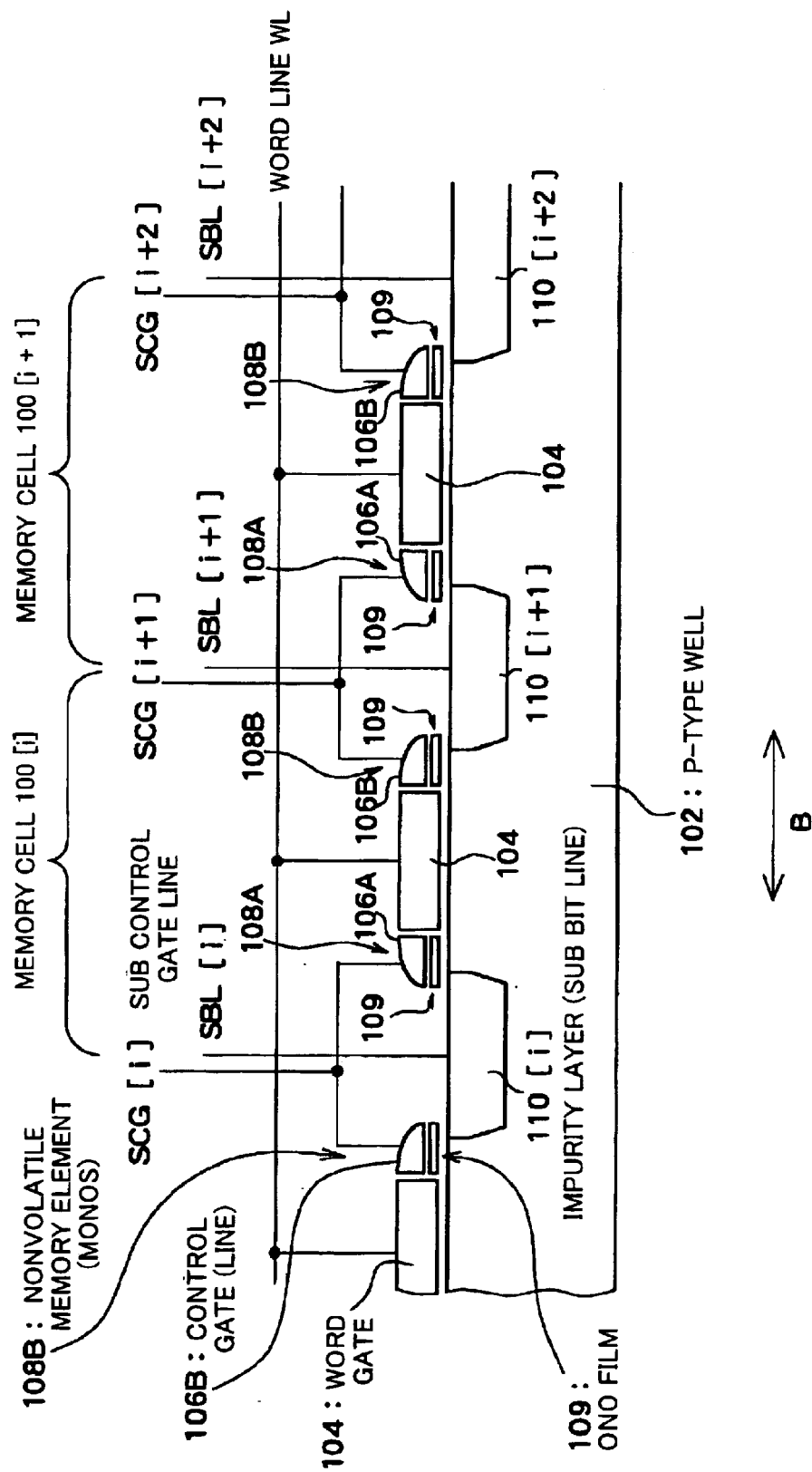
FIG. 1 is a cross-sectional view showing memory cells used in a non-volatile semiconductor memory device according to one embodiment of the present invention.
Figure 2:
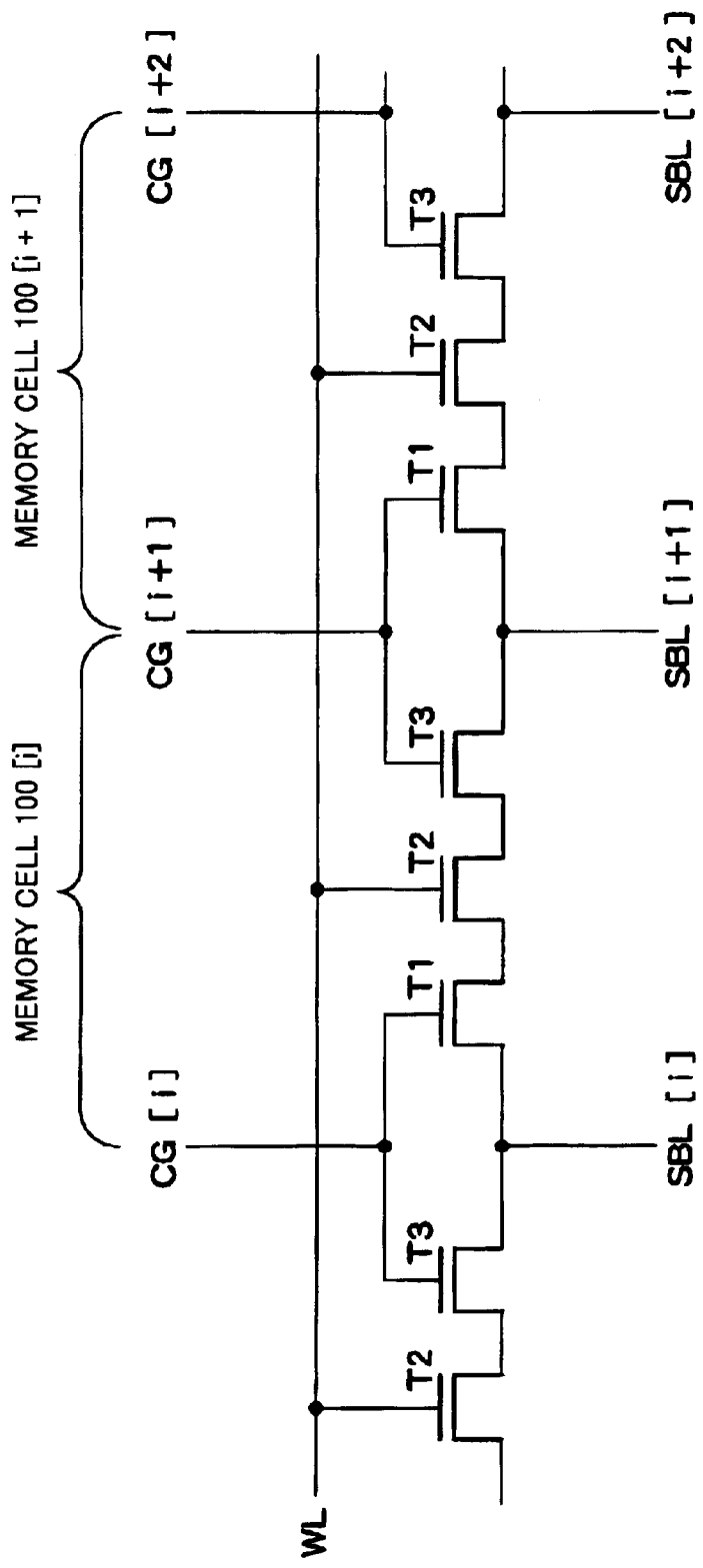
FIG. 2 is an equivalent circuit diagram of the memory cells shown in FIG. 1.

FIG. 1 is a view showing a cross section of a non-volatile semiconductor memory device. FIG. 2 is an equivalent circuit diagram of the non-volatile semiconductor memory device. In FIG. 1, one memory cell 100 includes a word gate 104 formed of a polycide or the like on a P-type well 102 through a gate insulating film, first and second control gates 106A and 106B, and first and second memory elements (MONOS memory cells) 108A and 108B.

The first and second control gates 106A and 106B are formed on opposite sidewalls of the word gate 104. The first and second control gates 106A and 106B are electrically insulated from the word gate 104.

Each of the first and second memory elements 108A and 108B is formed by layering an oxide film (O), nitride film (N), and oxide film (O) between either the first control gate 106A or the second control gate 106B formed of polysilicon corresponding to M (Metal) in the MONOS and the P-type well 102 corresponding to S. The first and second control gates 106A and 106B may be formed using a conductive material such as a silicide.

As described above, one memory cell 100 includes the first and second MONOS memory cells 108A and 108B, each having a split gate (first and second control gates 106A and 106B). One word gate 104 is shared by the first and second MONOS memory cells 108A and 108B.

The first and second MONOS memory cells 108A and 108B function as charge trap sites. Each of the first and second MONOS memory cells 108A and 108B can trap charges in the ONO film 109.

As shown in FIGS. 1 and 2, a plurality of word gates 104 arranged at intervals in the row direction (second direction B in FIGS. 1 and 2) is connected in common with one word line WL formed of a polycide or the like.

The control gates 106A and 106B shown in FIG. 1 extend along the column direction (first direction A perpendicular to the surface of FIG. 1) and are shared by a plurality of memory cells 100 arranged in the column direction. Therefore, the control gates 106A and 106B may be referred to as control gate lines.

A sub control gate line SCG [i+1] formed of a first metal layer in an upper layer of the word gate, control gate, and word line is connected with the control gate line 106B in the [i]th memory cell 100 [i] and the control gate line 106A in the [i+1]st memory cell 100 [i+1].

An [i+1]st impurity layer 110 [i+1] shared by the MONOS memory cell 108B in the [i]th memory cell 100 [i] and the MONOS memory cell 108A in the [i+1]st memory cell 100 [i+1] is formed in the P-type well 102.

The impurity layers 110 [i], 110 [i+1], and 110 [i+2] are n-type impurity layers formed in the P-type well, for example. The impurity layers 110 [i], 110 [i+1], and 110

[i+2] function as sub bit lines which extend along the column direction (first direction A perpendicular to the surface of FIG. 1) and are shared by a plurality of memory cells 100 arranged in the column direction. Therefore, the impurity layers 110 [i], 110 [i+1], 110 [i+2] may be referred to as sub bit lines SBL [i], SBL [i+1], and SBL [i+2].

Memory Cell Data Read

As shown in FIG. 2, a transistor T2 driven by the word gate 104 and transistors T1 and T3 respectively driven by the first and second control gates 106A and 106B are connected in series in one memory cell 100.

Figure 3:
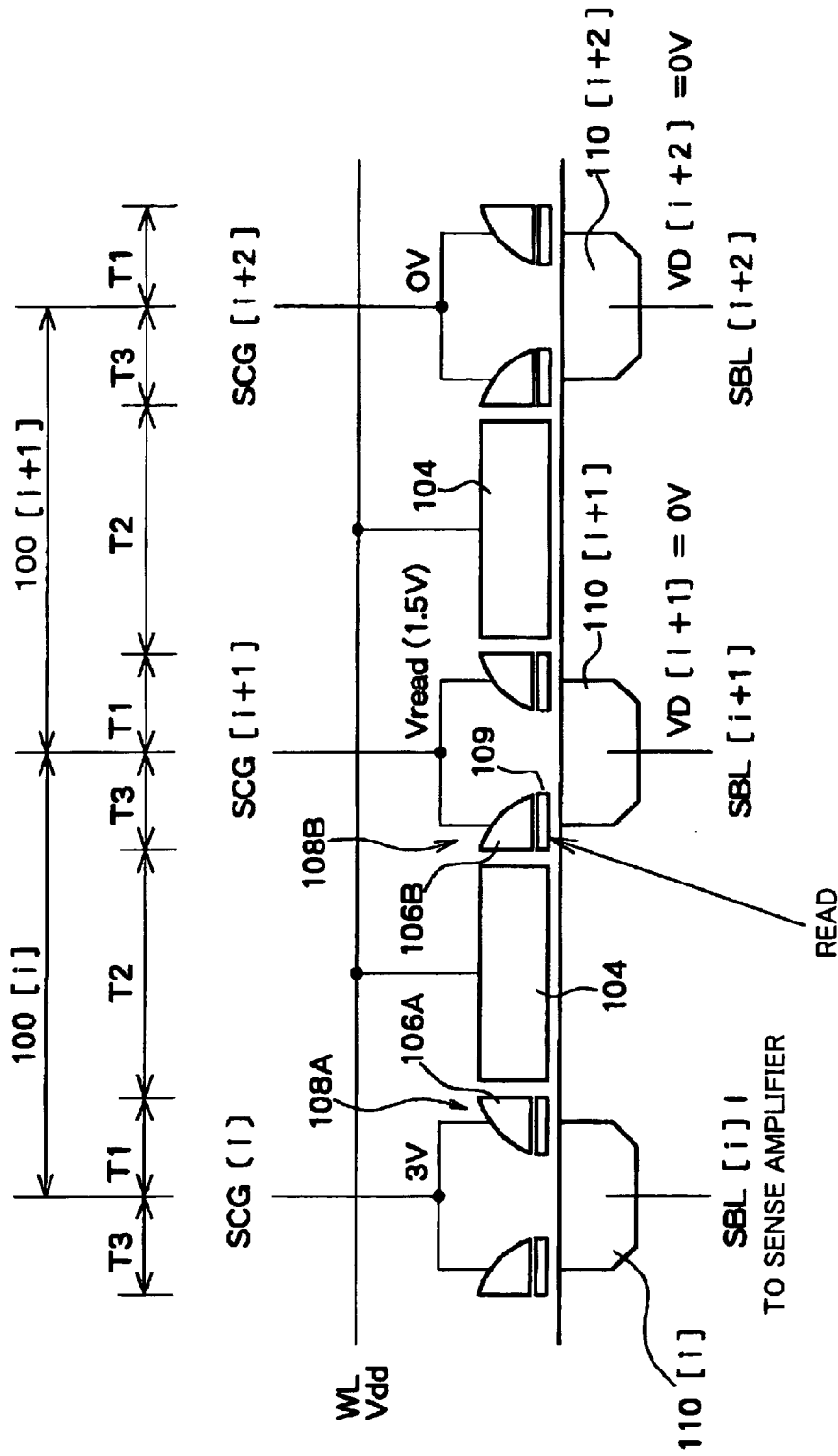
FIG. 3 schematically illustrates a data read operation in the non-volatile semiconductor memory device shown in FIG. 1.

Setting of the potential at each point of two adjacent memory cells 100 [i] and 100 [i+1] is described below with reference to FIG. 3. FIG. 3 is a view for describing reading of data from the MONOS memory cell 108B on the right of the word gate 104 in the memory cell 100 [i].

In this case, each of the transistors T2 is turned ON by applying a voltage Vdd (1.8 V, for example) to each of the word gates 104 in the same row as the memory cell 100 [i]. The transistor T1 corresponding to the MONOS memory cell 108A is turned ON by applying an override voltage (3 V, for example) to the control gate 106A on the left side of the memory cell 100 [i] through the sub control gate line SCG [i]. A read voltage Vread (1.5 V, for example) is applied as a potential VCG of the control gate 106B on the right side of the memory cell 100 [i].

The operation of the transistor T3 corresponding to the MONOS memory cell 108B differs as described below depending upon whether or not charges are stored in the MONOS memory cell 108B on the right of the word gate 104.

Figure 4:
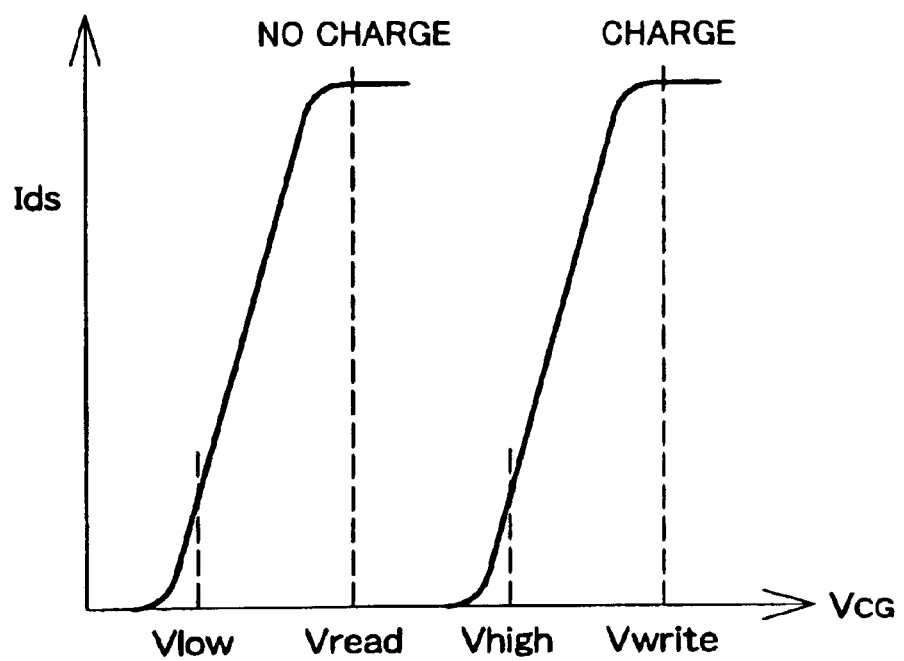
FIG. 4 is a characteristic diagram showing the relationship between a control gate voltage VCG and a source-drain current Ids in the memory cells shown in FIG. 1.

FIG. 4 shows the relation between a voltage applied to the control gate 106B on the right side of the memory cell 100 [i] and a current Ids which flows between source/drain of the transistor T3 corresponding to the MONOS memory cell 108B controlled by this voltage.

As shown in FIG. 4, in the case where charges are not stored in the MONOS memory cell 108B, the current Ids starts to flow when the control gate potential VCG exceeds a lower threshold voltage Vlow. In the case where charges are stored in the MONOS memory cell 108B, the current Ids does not start to flow unless the control gate potential VCG exceeds a higher threshold voltage Vhigh.

The voltage Vread applied to the control gate 106B at the time of reading data is set to approximately an intermediate voltage between the two threshold voltages Vlow and Vhigh.

Therefore, the current Ids flows if charges are not stored in the MONOS memory cell 108B, and the current Ids does not flow if charges are stored in the MONOS memory cell 108B.

At the time of reading data, a potential VD [i] of the sub bit line SBL [i] (impurity layer 110 [i]) is set to the sense amplifier and the potential VD [i+1] of the sub bit line SBL [i+1] (impurity layer 110 [i+1]) is set to 0 V. This allows the current Ids to flow when charges are not stored in the MONOS memory element 108B (selected side), whereby a current of 25 µA or more flows through the sub bit line SBL [i] on the opposite side through the transistors T1 and T2 in an ON state, for example. Since the current Ids does not flow when charges are stored in the MONOS memory element 108B (selected side), current flowing through the sub bit line SBL [i] on the opposite side is less than 10 nA even if the transistors T1 and T2 are in an ON state, for example.

Therefore, data can be read from the MONOS memory element 108B (selected side) in the memory cell 100 [i] by detecting the current flowing through the sub bit line SBL [i] on the opposite side using the sense amplifier.

The transistors T1 and T2 are turned ON in the memory cell 100 [i+1]. However, since the control gate potential VCG of the transistor T3 is set to 0 V, which is lower than the threshold voltages Vlow and Vhigh shown in FIG. 3, the source-drain current does not flow in the memory cell 100 [i+1]. Therefore, data storage conditions in the memory cell 100 [i+1] do not adversely affect the reading of data from the memory cell 100 [i].

In the case of reading data from the MONOS memory cell 108A on the left side of the memory cell 100 [i], the potential at each point of the memory cell 100 [i−1] and [i] may be set in the same manner as described above.

Memory Cell Programming

Figure 5:
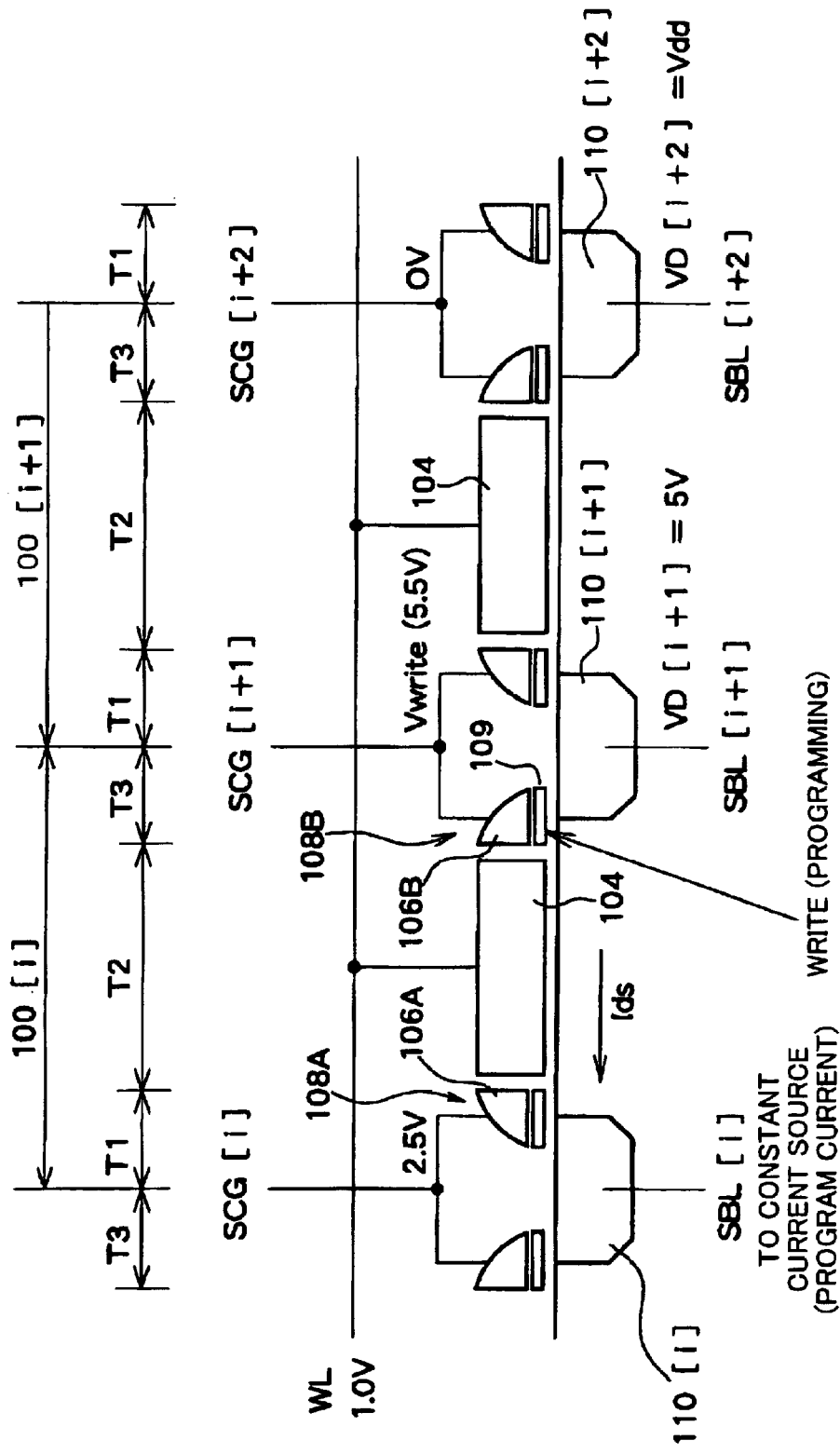
FIG. 5 schematically illustrates a data write (program) operation in the non-volatile semiconductor memory device shown in FIG. 1.

FIG. 5 is a view for describing data programming of the MONOS memory cell 108B on the right of the word gate 104 in the memory cell 100 [i]. A data erase operation described later has been performed before this data program operation.

In FIG. 5, the potential of the sub control gate line SCG [i] is set to the override potential (2.5 V, for example) and the potential of the sub control gate line SCG [i+2] is set to 0 V in the same manner as shown in FIG. 3. The potential of each word gate 104 is set to a programming word line select voltage which is lower than the power supply voltage Vdd (about 1.0 V, for example) by the word line WL. The potential of the control gate 106B on the right side of the memory cell 100 [i+1] is set to a write potential Vwrite (5.5 V, for example) shown in FIG. 4 through the sub control gate line SCG [i+1]. The potential VD [i+1] of the [i+1]st impurity layer 110 [i+1] (sub bit line SBL [i+1]) is set to 5 V, for example. The potential VD [i] of the [i]th impurity layer 110 [i] (bit line BL [i]) is set to a voltage when a program current of 5 µA is caused to flow (0 to 1 V), for example.

This causes the transistors T1 and T2 in the memory cell 100 [i] to be turned ON, whereby the current Ids flows toward the impurity layer 110 [i]. At the same time, channel hot electrons (CHE) are trapped in the ONO film 109 of the MONOS memory cell 108B. The program operation of the MONOS memory cell 108B is performed in this manner, whereby data "0" or "1" is written in.

Memory Cell Data Erasure

Figure 6:
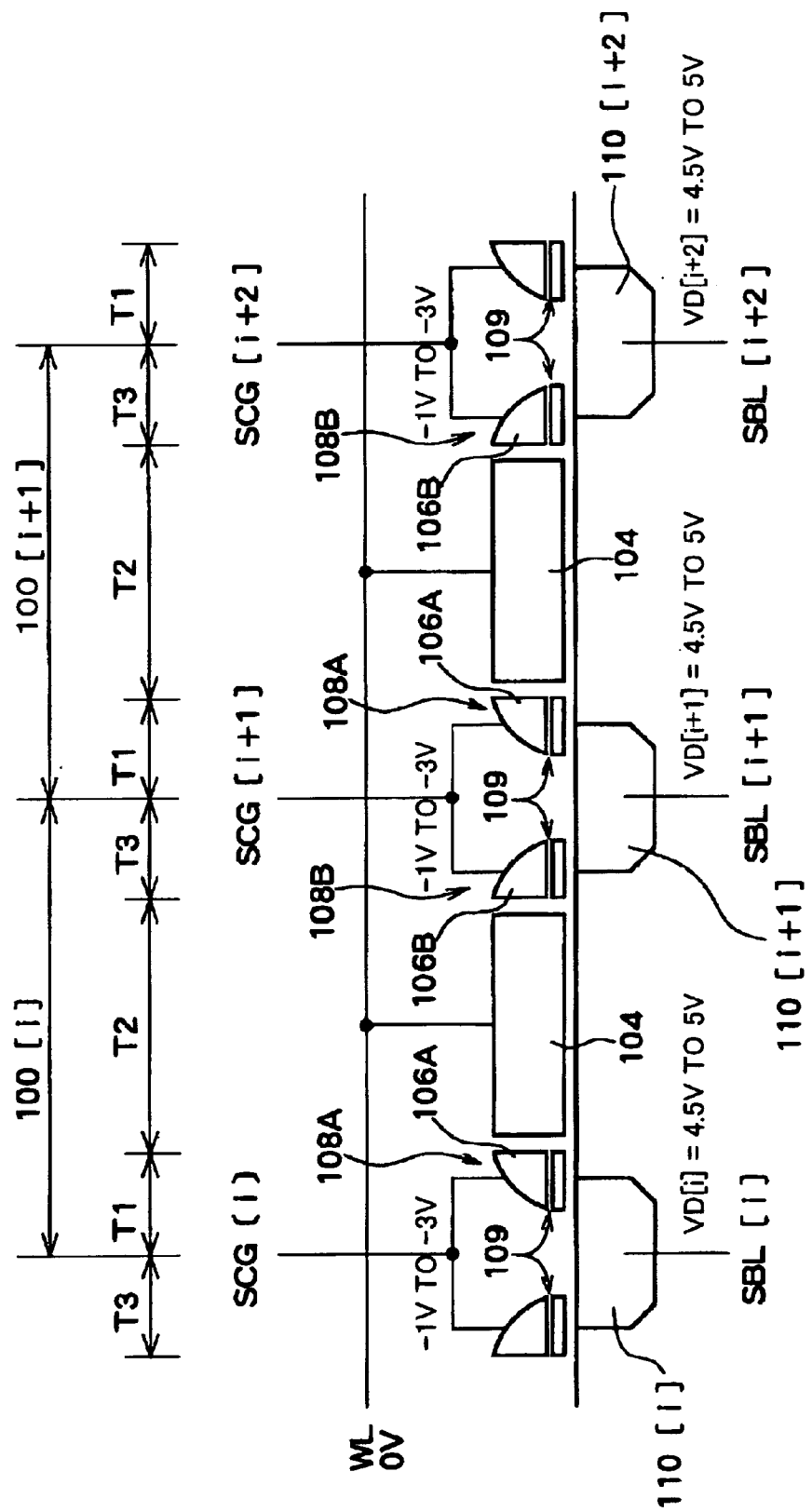
FIG. 6 schematically illustrates a data erase operation in the non-volatile semiconductor memory device shown in FIG. 1.

FIG. 6 is a view for describing data erasure of the memory cells 100 [i] and [i+1] connected with the word line WL.

In FIG. 6, the potential of each word gate 104 is set to 0 V by the word line WL, for example. The potential of the control gates 106A and 106B is set to about −1 to −3 V (first high potential for erasure) by the sub control gate lines SCG [i], [i+1], and [i+2], for example. The potential of the impurity layers (sub bit lines) 110 [i], 110 [i+1], and 110 [i+2] is set to 4.5 to 5 V (second high potential for erasure) equal to the potential of the P-type well.

This causes electrons trapped in the ONO films 109 of the MONOS memory cells 108A and 108B to be extracted and erased by a tunnel effect caused by an electric field formed by the first high potential for erasure being applied to the metal (M) and the second high potential for erasure being applied to the silicon (S). This enables data to be erased in a plurality of memory cells at the same time. Differing from the above example, the stored electrons may be erased by forming hot holes using band-band tunneling on the surface of the impurity layers which become the bit lines.

Overall Configuration

The entire configuration of the non-volatile semiconductor memory device formed by using the above-described memory cells 100 is described below with reference to FIGS. 7A to 7E.

FIG. 7A is a view showing a planar layout of one chip of non-volatile semiconductor memory device. Each of memory cell array regions 200A and 200B on either side of a word line driver section 201 is divided into 32 sector regions 210, for example. One chip of non-volatile semiconductor memory device has the 0th to 63rd sector regions 210.

As shown in FIG. 7A, each of the memory cell array regions 200A and 200B on either side is divided into 32 sector regions 210 in the second direction (row direction) B. Each of the sector regions 210 has a rectangular shape in which the first direction (column direction) A is the longitudinal direction. The sector region 210 is a minimum unit for data erasure. Data stored in the sector region 210 is batch-erased.

Each of the left and right memory array regions 200A and 200B has 4K word lines WL and 2K sub bit lines SBL, for example. In the present embodiment, since two MONOS memory cells 108A and 108B are connected with one sub bit line SBL, 2K sub bit lines SBL mean a storage capacity of 4 kbits. Since the non-volatile semiconductor memory device shown in FIG. 7A has the memory array regions 200A and 200B on either side, the non-volatile semiconductor memory device has a storage capacity defined by (4K word lines WL)×(2K sub bit lines SBL)×2×2 as the entire memory. The storage capacity of each sector region 210 is 1/64 of the storage capacity of the entire memory. Each sector region 210 has a storage capacity defined by (4K word lines WL)×(64 sub bit lines SBL)×2.

FIG. 7B is a view showing the details of one sector region 210 of the non-volatile semiconductor memory device shown in FIG. 7A. As shown in FIG. 7B, each sector region 210 is divided in the second direction and has memory blocks for I/O0 to I/O15 (memory blocks corresponding to input/output bits) 214 so that 16-bit data can be read from or written in the memory blocks.

As shown in FIG. 7B, each memory block 214 has 4k (4096) word lines WL. As shown in FIG. 7C, the sector region 210 is divided into eight large blocks 212 in the first direction A. Each of the large blocks 212 is divided into eight small blocks 215 in the first direction A, as shown in FIG. 7D.

As shown in FIG. 7E, each small block 215 has 64 word lines WL. Each small block 215 consists of 16 small memory blocks 216 arranged along the row direction.

Therefore, the total number of word lines WL arranged in one large block 212 (including the word lines for redundancy) is 64×8 (small block)=512. Therefore, the total number of word lines WL arranged in one sector region 210 is 512×8 (large block)=4096.

Sector Region Details

Figure 8:
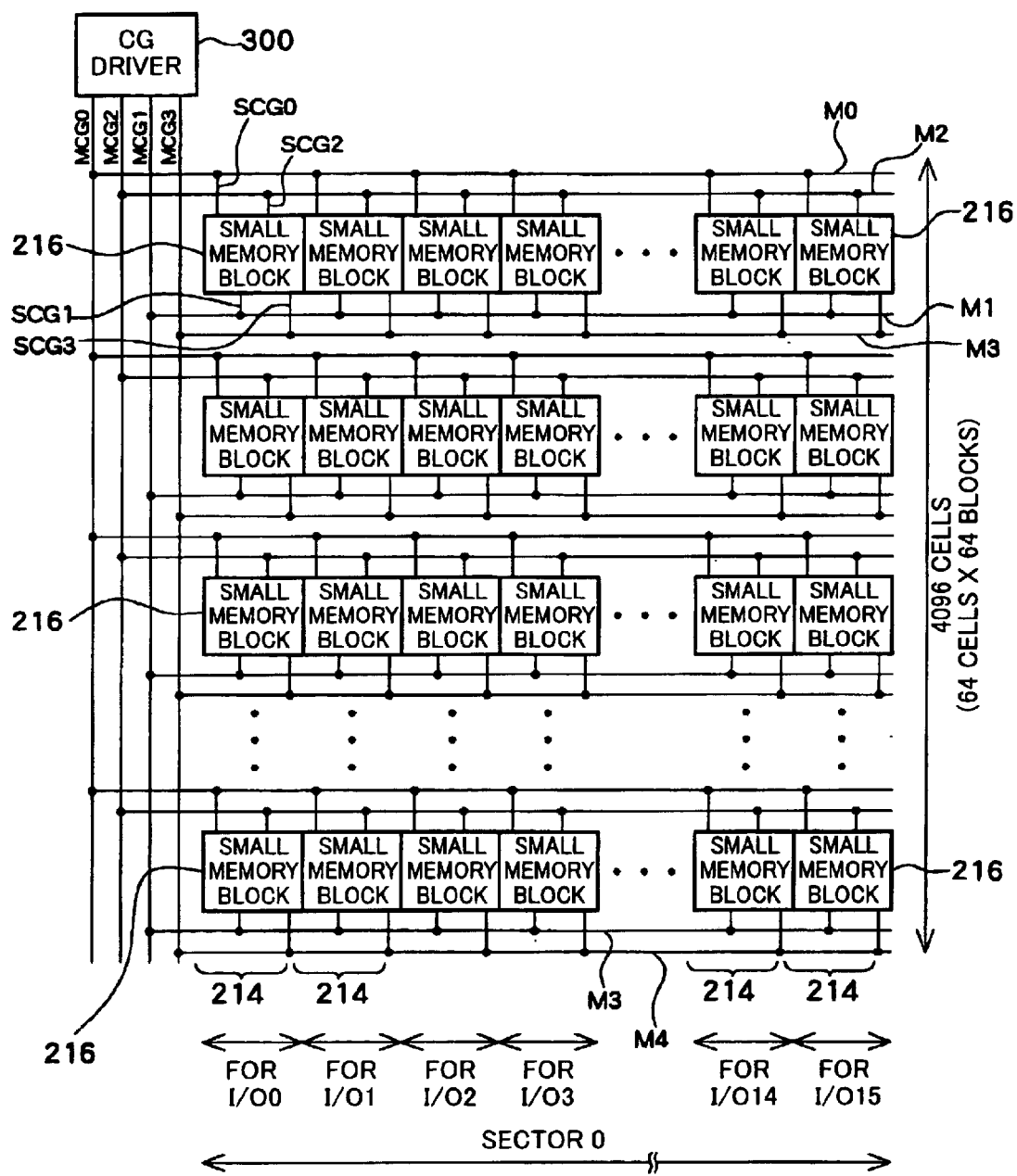
FIG. 8 schematically illustrates memory cells in one sector region shown in FIG. 7B and interconnects for the memory cells.

FIG. 8 is a view showing the details of the sector region 0 shown in FIG. 7A and a CG driver.

As shown in FIG. 8, 64 small memory blocks 216 are arranged in the column direction in one sector region 0.16 small memory blocks 216 are arranged in the row direction corresponding to the I/O0 to I/O15 for performing 16-bit input/output.

16 sub control gate lines SCG0 of 16 small memory blocks 216 arranged in the row direction are connected in common with a second metal interconnect layer M0 extending in the row direction, for example. 16 sub control gate lines SCG1, 16 sub control gate lines SCG2, and 16 sub control gate lines SCG3 are respectively connected in common with a metal interconnect M1, metal interconnect M2, and metal interconnect M3.

A CG driver 300 is provided as a control gate drive section of the sector region 0. Four main control gate lines MCG0 to MCG3 are formed to extend from the CG driver 300 in the column direction. The main control gate lines MCG0 to MCG3 are formed of a third metal interconnect layer, for example.

Figure 9:
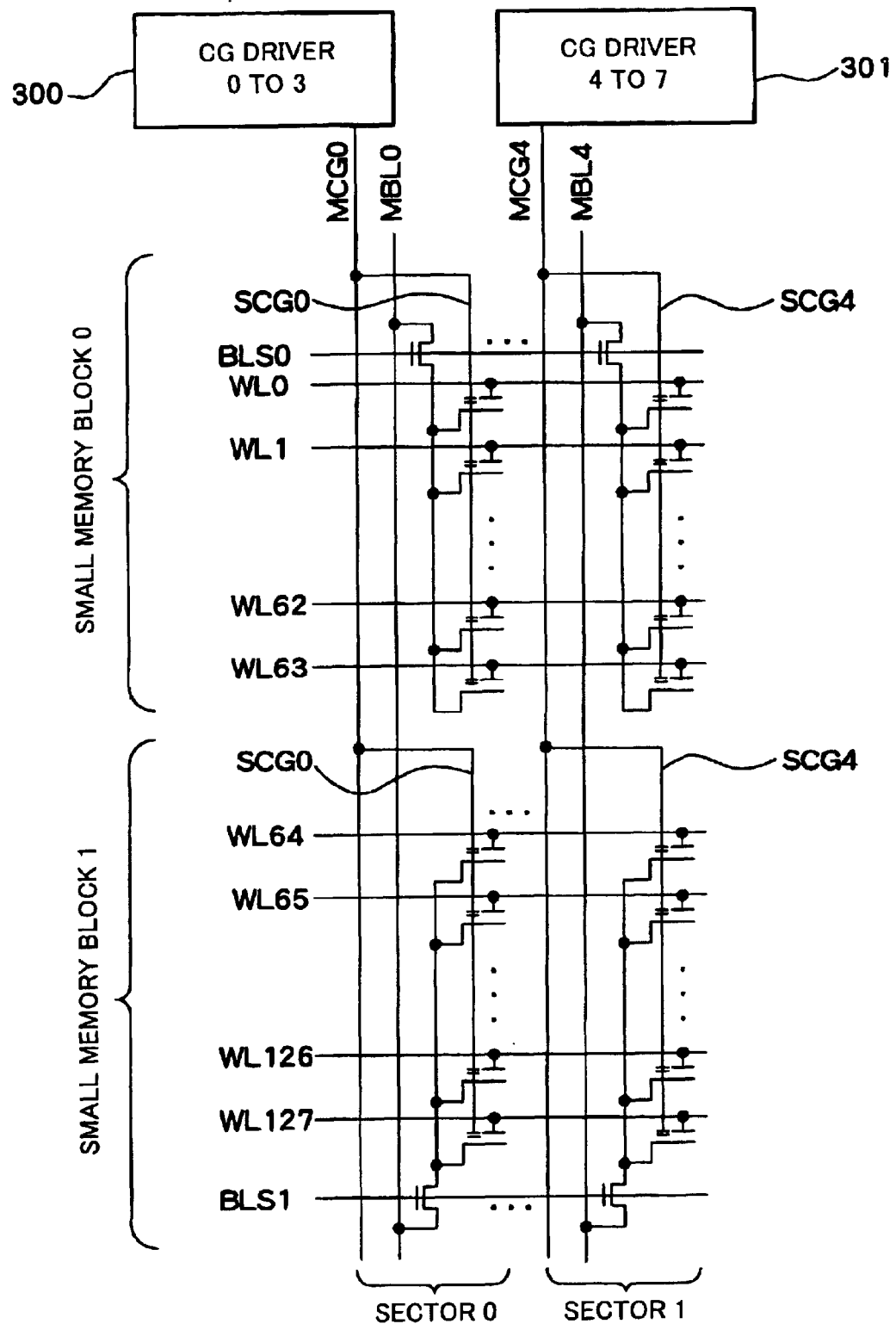
FIG. 9 is a circuit diagram showing the relationship between the adjacent sector regions.

FIG. 9 is a view showing the relation between the sector region 0 and the sector region 1 adjacent thereto. The word lines WL are shared by the sector region 0 and the sector region 1. However, the main control gate lines MCG and the main bit lines MBL are separately provided in the sector region 0 and the sector region 1. The CG driver 300 corresponding to the sector region 0 and a CG driver 301 corresponding to the sector region 1 are illustrated in FIG. 9. The CG drivers are separately formed for each sector region.

Taking the sector 0 as an example, a plurality of sub control gate lines SCG0 disposed for each small memory block 216 is connected in common with the main control gate line MCG0. A gate circuit is not disposed in the route from the main control gate line MCG0 to the sub control gate line SCG0. This also applies to sector regions other than the sector region 0.

Configuration of Small Memory Block

Figure 10:
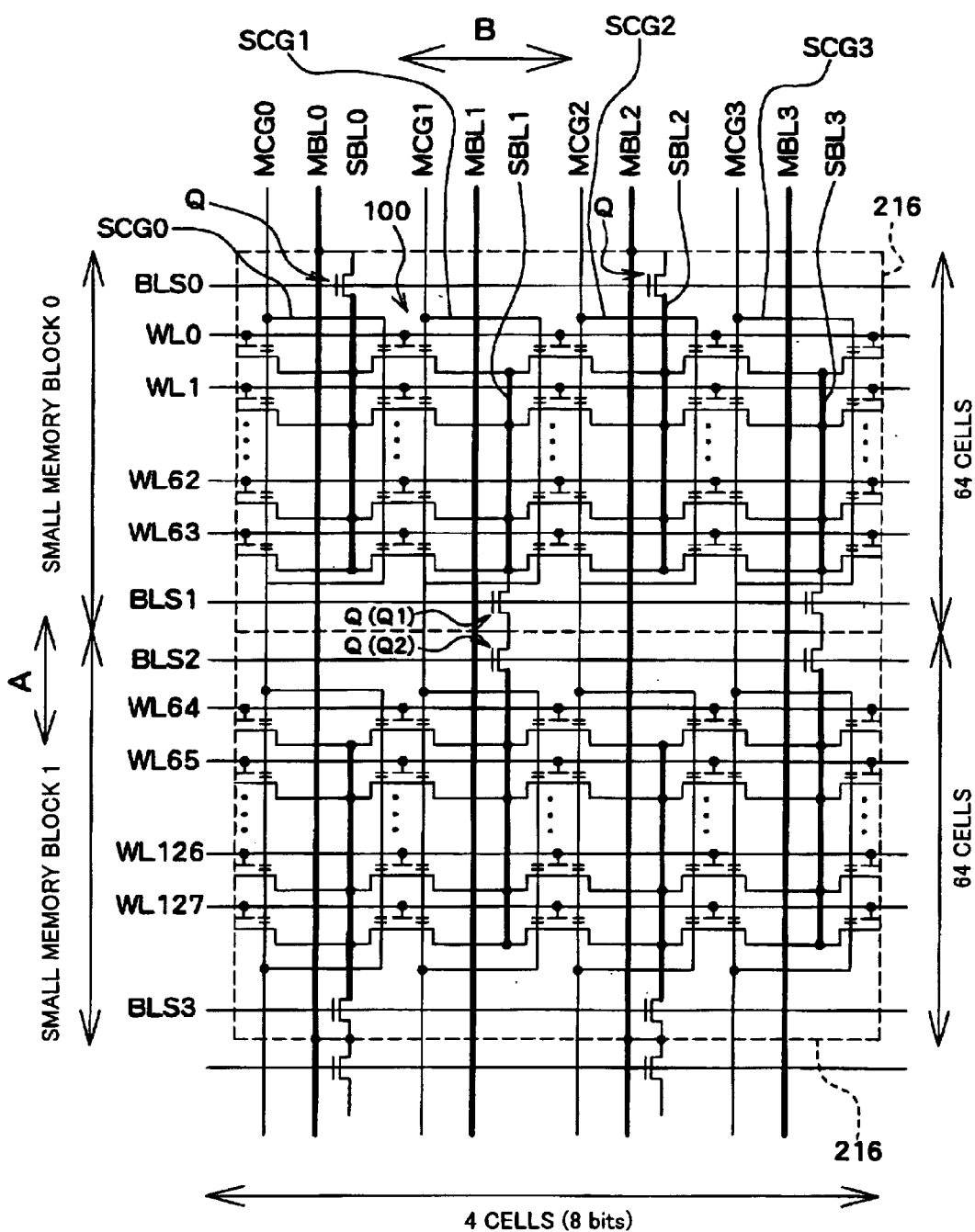
FIG. 10 is a schematic diagram showing the memory cells in the memory cell array region and the interconnects for the memory cells.
Figure 11:
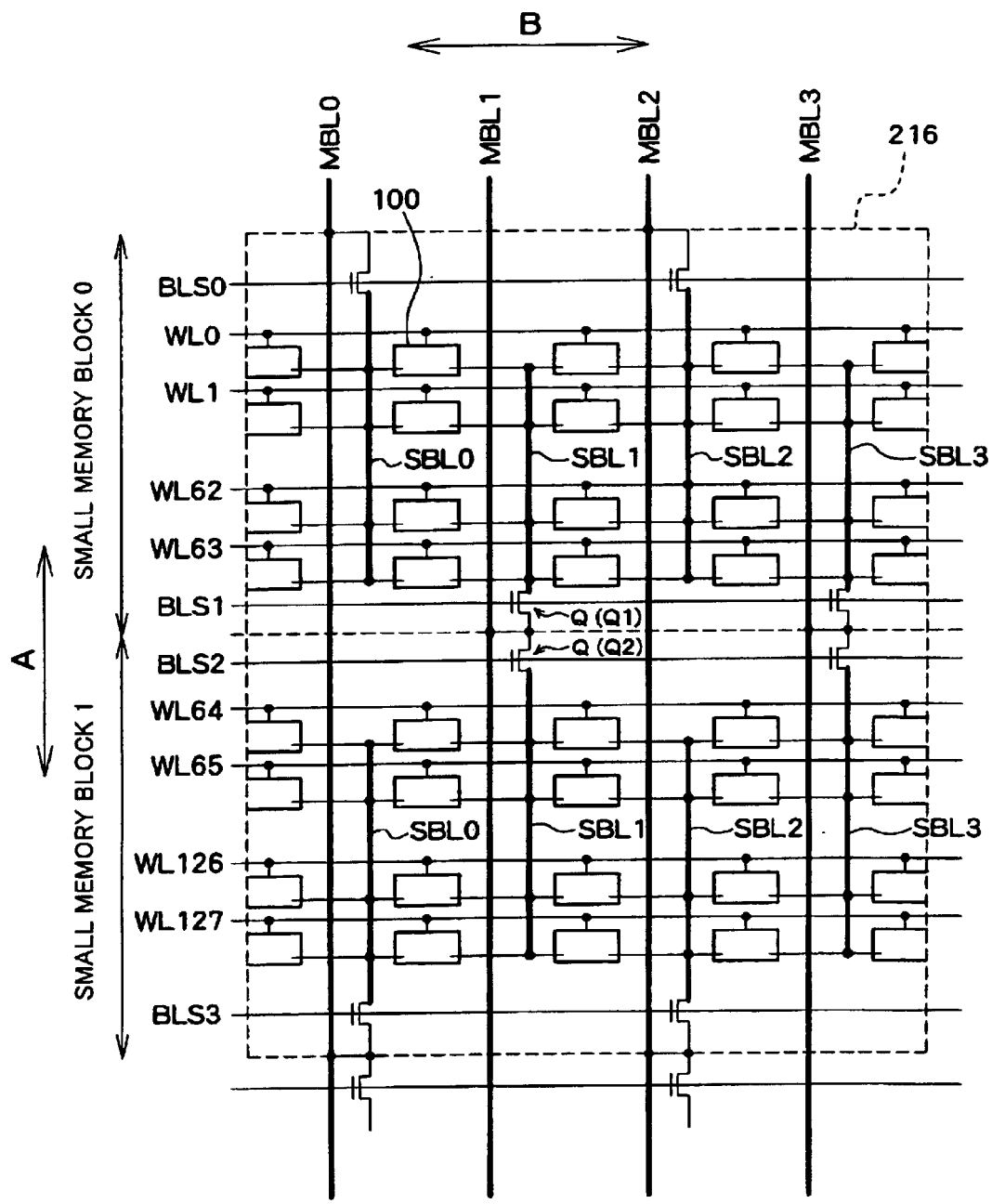
FIG. 11 is a diagram showing the relationship between sub bit lines and main bit lines in the memory cell array region shown in FIG. 10.

The small memory block 216 is described below in detail. FIG. 10 is a schematic circuit diagram for describing the memory cells in the memory cell array region including the small memory blocks and interconnects for the memory cells. FIG. 11 is a circuit wiring diagram clearly showing the relation between the sub bit lines and the main bit lines in the memory cell array region shown in FIG. 10.

The small memory block 216 has the memory cells 100 in 64 rows and 4 columns, for example. Four sub control gate lines SCG0 to SCG3 formed of polysilicon in the shape of a sidewall, for example, four sub bit lines SBL0 to SBL3 which are data input/output lines, and 64 word lines WL are connected to one small memory block 216.

Each second control gate 106B of an memory cell in an even-numbered column (0th row or second row) and each first control gate 106A of an memory cell in an odd-numbered column (first row or third row) are commonly connected to an even-numbered sub-control gate line SCG0 or SCG2. Similarly, each second control gate 106B of an memory cell in an odd-numbered column (0th row or second row) and each first control gate 106A of an memory cell in an even-numbered column (first row or third row) are commonly connected to an odd-numbered sub-control gate line SCG1 or SCG3.

Each of the sub bit lines SBL0 to SBL3 extends in the first direction (column direction) A and is connected in common with a plurality of memory cells formed on either side. Each of the sub bit lines SBL0 to SBL3 is connected with one of a plurality of main bit lines MBL0 to MBL3.

As shown in FIGS. 10 and 11, switching elements Q which select connection/disconnection between the sub bit lines SBL and the main bit lines MBL are formed at connections between the sub bit lines SBL and the main bit lines MBL. The switching elements Q are formed at end portions of the sub bit lines SBL. The switching elements Q are turned ON/OFF based on the potential of select signal lines BLS. When the switching element Q is turned ON, the sub bit line SBL and the main bit line MBL are in a conductive state in the selected small memory block 216. The sub bit line SBL in the non-selected small memory block 216 is made to be in a floating state.

Each of the switching elements Q is connected to an end portion of an even-numbered sub bit line SBL0 or SBL2 on one side, or connected to an end portion of an odd-numbered sub bit line SBL1 or SBL3 on the opposite side. Specifically, the switching elements Q connected to the even-numbered sub bit lines SBL0 and SBL2 and the switching elements Q connected to the odd-numbered sub bit lines SBL1 and SBL3 are disposed on opposite sides.

In two small memory blocks 216 adjacent to each other in the first direction A, when switching elements Q in one small memory block 216 are referred to as first select transistors Q1 and switching elements Q in the other small memory block 216 are referred to as second select transistor Q2, the first select transistor Q1 and the second select transistor Q2 commonly connected to one of the main bit line MBL are adjacent to each other.

The features of the present embodiment in this section are described below.

(1) The sub bit line SBL is connected with the main bit line MBL through the switching element Q. Therefore, a selected sub bit line SBL and a main bit line MBL connected thereto can be put in a conductive state, and a non-selected sub bit line SBL and a main bit line MBL connected thereto can be put in a non-conductive state. As a result, wiring capacitance of the sub bit line SBL at the time of reading/ writing can be reduced, whereby the memory cells can be accessed at a higher speed at the time of reading/writing.

(2) The switching elements Q are provided at the end portions of the even-numbered sub bit lines SBL0 and SBL2 on one side, or at the end portions of the odd-numbered sub bit lines SBL1 and SBL3 on the opposite side. This enables the following actions and effects to be obtained.

(2-1) The distance between one of the switching elements Q and the memory cell 100 and the distance between the other switching element Q and the memory cell 100 are equal between each memory cell 100. Therefore, the sum of the resistance of the sub bit lines SBL is equal between each memory cell 100. As a result, the potential difference applied between the source-drain is fixed between each memory cell 100, whereby unevenness of the characteristics can be reduced.

(2-2) Since the switching elements Q of the odd-numbered sub bit lines SBL can be disposed in the space between the even-numbered sub bit lines SBL, the channel width of the switching elements Q of the odd-numbered sub bit lines SBL can be increased. Similarly, the channel width of the switching elements Q of the even-numbered sub bit lines SBL can be increased.

(2-3) The first and second select transistors Q1 and Q2 connected with the same main bit line MBL are formed next to each other. This enables the impurity layer of the select transistors to be shared. As a result, the degree of integration of the memory can be increased.

Planar Layout of Small Memory Block

Figure 12:
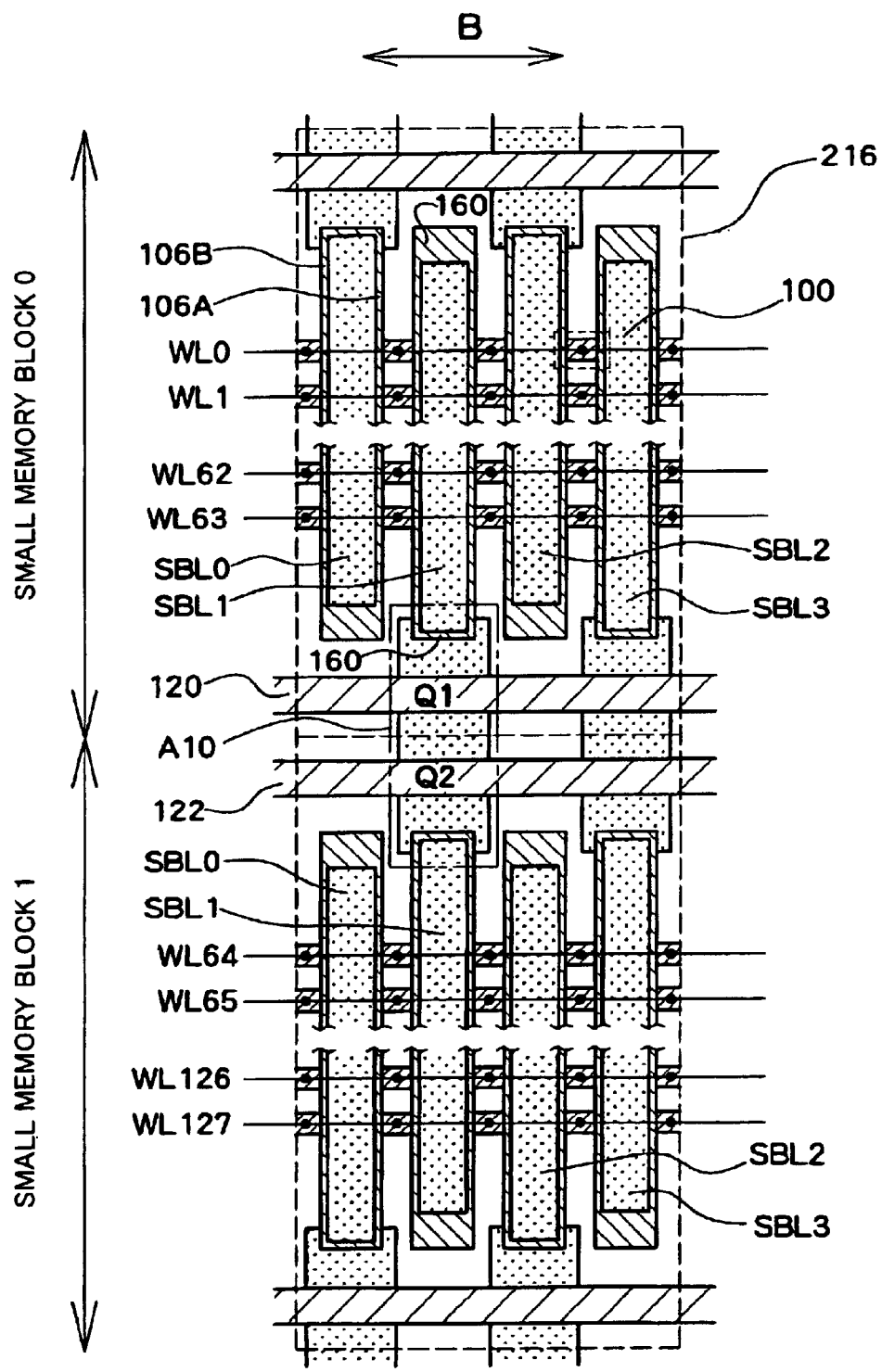
FIG. 12 is a plan view showing a layout of the memory cell array region shown in FIGS. 10 and 11.

FIG. 12 is a view showing a planar layout of the non-volatile semiconductor memory device in bulk shown in FIGS. 10 and 11. In FIG. 12, the word lines WL are schematically indicated by lines.

Each of the sub bit lines SBL0 to SBL3 consists of sub bit impurity layers formed in the semiconductor substrate. Each of the sub bit lines SBL0 to SBL3 is formed between the first control gate 106A and the second control gate 106B. The first and second control gates 106A and 106B have two continuous sections 160 in which the end portions of the first and second control gates 106A and 106B are connected. Since the first and second control gates 106A and 106B have two continuous sections on opposite ends, the resistance of the control gates can be halved in comparison with the case where the continuous section is formed only on one end.

Strap group regions A10 are formed between the sub bit lines SBL adjacent in the first direction (column direction) A (for example, between the sub bit line SBL1 in the small memory block 0 and the sub bit line SBL1 in the small memory block 1). The first and second select transistors Q1 and Q2 are formed in each strap group region A10. The first select transistor Q1 selects connection/disconnection between the sub bit line SBL on one side of the strap group region A10 and the main bit line MBL. The second select transistor Q2 selects connection/disconnection between the sub bit line SBL on the other side of the strap group region A10 and the main bit line MBL. The select transistors Q1 and Q2 may be formed by field effect transistors (MOS transistors, for example).

Figure 13:
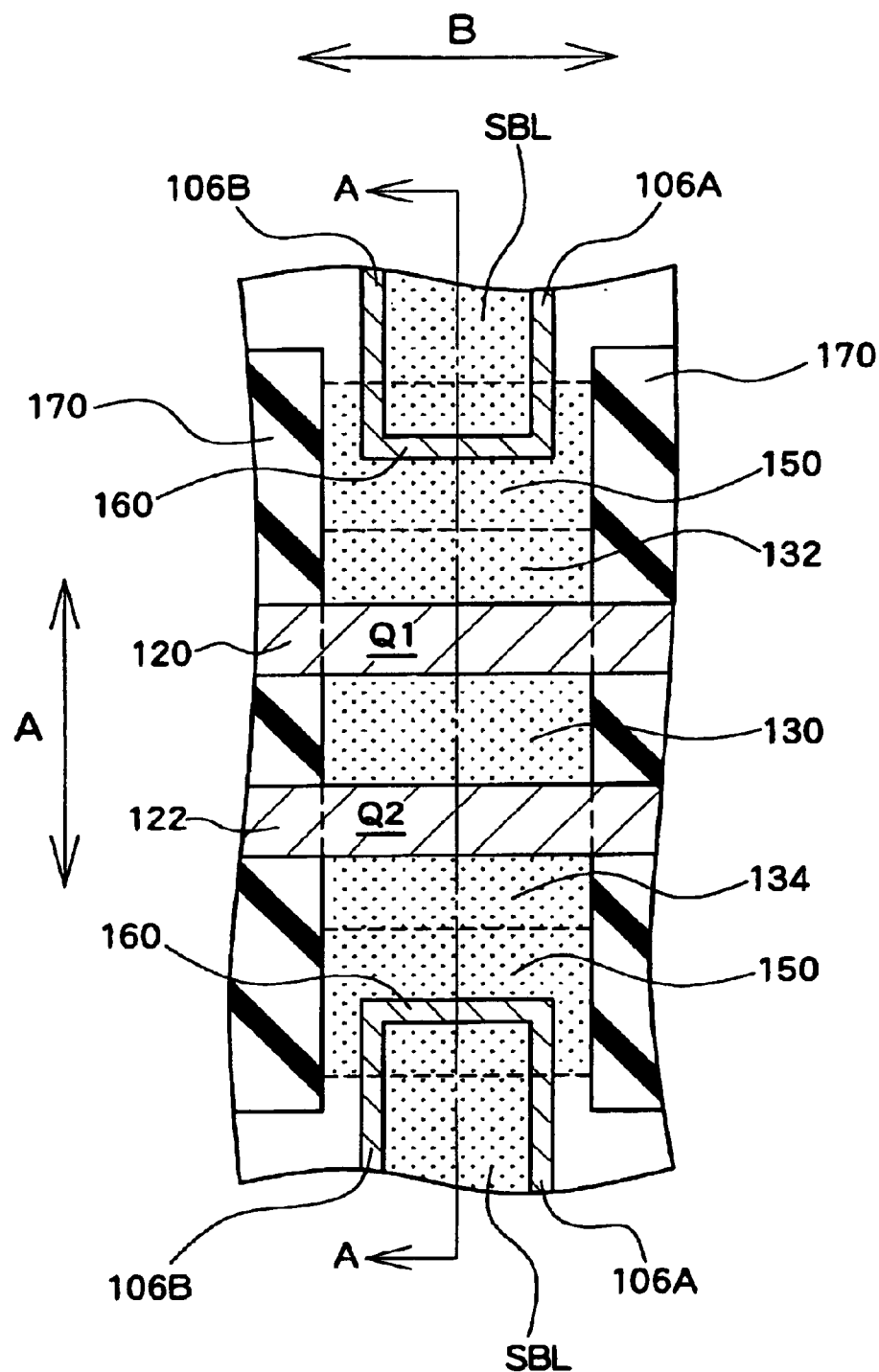
FIG. 13 is an enlarged plan view of a strap group region (region indicated by A10) shown in FIG. 12.
Figure 14:
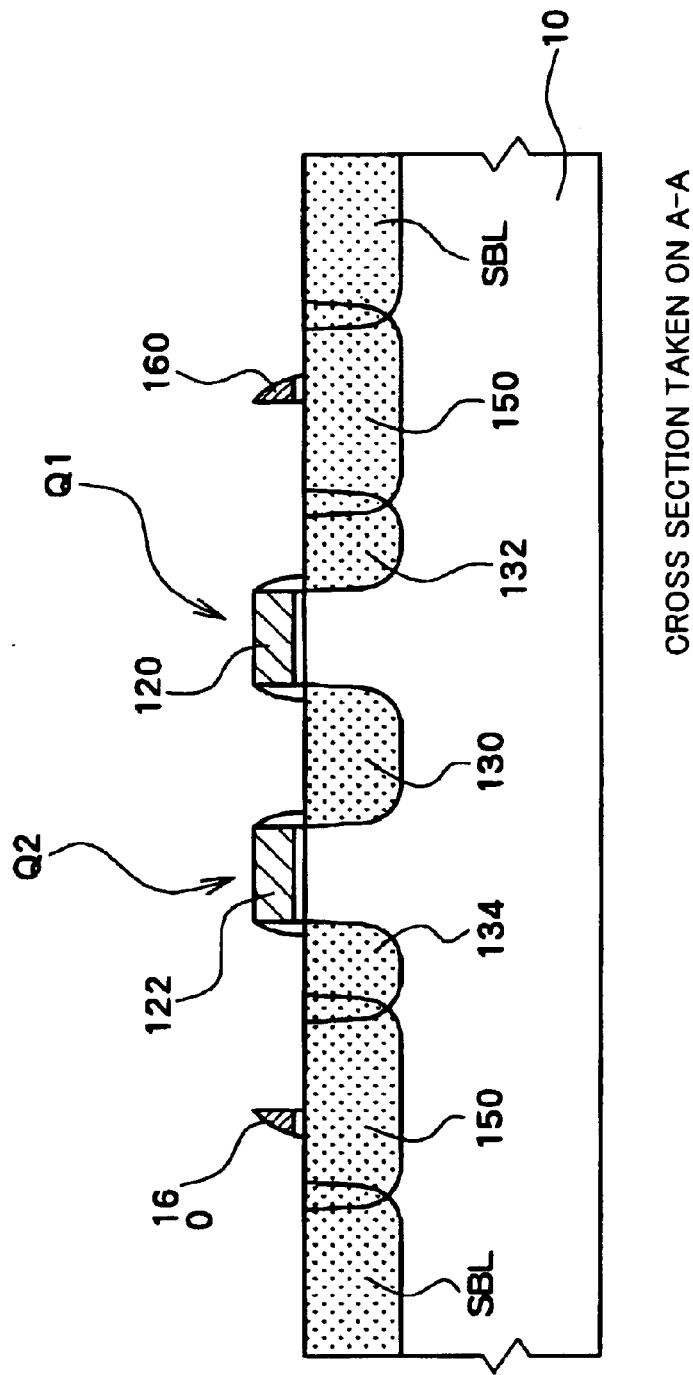
FIG. 14 is a schematic cross-sectional view taken along the line A—A shown in FIG. 13.

The strap group region A10 is described below in detail with reference to FIG. 13. FIG. 13 is an enlarged plan view of the strap group region A10 shown in FIG. 12. FIG. 14 is a cross-sectional view schematically showing the cross section along the line A—A shown in FIG. 13.

The strap group region A10 includes first and second gate electrodes 120 and 122 and first to third impurity layers 130, 132, and 134. In the case where the sub bit lines SBL are formed of n-type impurity layers, conductivity type of the first to third impurity layers 130, 132, and 134 is n-type.

The regions of the select transistors Q1 and Q2 in the strap group region A10 are specified by element isolation regions 170.

The first and second gate electrodes 120 and 122 extend in the second direction B. The first impurity layer 130 is formed between the first and second gate electrodes 120 and 122. The first impurity layer 130 functions as a source or drain of the first and second select transistors Q1 and Q2. The first impurity layer 130 is shared by the first and second select transistors Q1 and Q2.

The second impurity layer 132 is formed between the first gate electrode 120 and the sub bit line (sub bit impurity layer) SBL. The second impurity layer 132 functions as the source or drain of the first select transistor Q1. The third impurity layer 134 is formed between the second gate electrode 122 and the sub bit line (sub bit impurity layer) SBL. The third impurity layer 134 functions as the source or drain of the second select transistor Q2.

As shown in FIGS. 13 and 14, crossunder impurity layers 150 are formed in the semiconductor substrate 10 under the continuous sections 160 of the first control gate 106A and the second control gate 106B. The second impurity layer 132 and the sub bit line (sub bit impurity layer) SBL are electrically connected through the crossunder impurity layer 150. Formation of the crossunder impurity layer 150 enables the sub bit line (sub bit impurity layer) SBL and the second impurity layer 150 which functions as the source or drain of the first select transistor Q1 to be electrically connected through the crossunder impurity layer 150 even if both ends of the first control gate 106A and the second control gate 106B are connected. In the case where the sub bit lines SBL are formed of n-type impurity layers, conductivity type of the crossunder impurity layer 150 is n-type.

Similarly, the third impurity layer 134 and the sub bit line (sub bit impurity layer) SBL are electrically connected through the crossunder impurity layer 150.

Operation

Tables 1 to 3 show the potential of the sub control gate line SCG, sub bit line SBL, and word line WL to be set at the time of erasing data and programming in the non-volatile semiconductor memory device of the present embodiment.

TABLE 1

| | Selected cell | | | |
|---|---|---|---|---|
| | SCG | SBL | WL | BLS |
| Erasure | −1 to −3V | 4.5V to 5V | 0V | 8V |
| Program | 5.5V or 2.5V | 5V | 1.0V | 8V |

TABLE 2

| | Non-selected cell (in selected sector) | | | |
|---|---|---|---|---|
| | SCG | SBL | WL | BLS |
| Erasure | — | — | — | — |
| Program | 5.5V or 2.5V or 0V | 0V | 0V | 8V |

TABLE 3

| | Non-selected cell (in Non-selected sector) | | | |
|---|---|---|---|---|
| | SCG | SBL | WL | BLS |
| Erasure | 0V | 0V | 0V | 8V |
| Program | 0V | 0V | 0V or 1V | 8V |

In Table 1, since all the memory cells in the sector region 0 (selected sector) become the selected cells at the time of erasing data, 0 V is supplied to 4096 word lines WL, for example. The first high potential for erasure (−1 to −3V, for example) is supplied to four main control gate lines MCG0 to MCG3 by the CG driver 300, whereby the first high potential for erasure is collectively supplied to the control gates 106A and 106B in all the memory cells in the sector region 0 (selected sector). At this time, the second high potential for erasure (4.5 to 5 V, for example) is supplied to all the sub bit lines SBL in the sector region 0. The method of supplying the second high potential for erasure is described later. A potential (8 V, for example) is supplied to the select signal lines BLS in the selected cells. This causes the switching elements to be turned ON, whereby the sub bit lines and the main bit lines in the selected cells are connected. Data can be erased in all the memory cells in the selected sector region 0 in this manner.

As shown in Table 3, 0 V is supplied to all 4096 word lines WL in the non-selected sector region 1, for example. However, since 0 V can be supplied to the sub control gate lines SCG and the sub bit lines SBL independently of the sector region 0, data is not erased in the non-selected sector.

A programming operation is described below. Programming of 16-bit data is performed at the same time in each MONOS memory cell corresponding to 16 I/Os in the selected sector region 0. In this example, 1 V is supplied to one word line WL connected with the selected cell in the sector region 0. Other 4095 word lines WL are set to 0 V. In 16 small memory blocks 216 in the sector region 0, 2.5 V is supplied to the sub control gate line SCG corresponding to SCG [i] shown in FIG. 5. 5.5 V is supplied to the sub control gate line SCG corresponding to SCG [i+1] shown in FIG. 5. Other sub control gate lines SCG are set to 0 V. In the memory blocks 214 corresponding to the I/O0 to I/O15 in the sector region 0, 5 V is supplied to one main bit line MBL corresponding to the bit line BL [i+1] shown in FIG. 5. Other main bit lines MBL are set to 0 V. The sub bit line SBL in the selected memory cell is connected with the main bit line MBL by causing the switching element to be turned ON based on the potential of the select signal line BLS.

In the non-selected cells in the selected sector region 0, the word lines WL are set to 0 V and a high potential of 5.5 V or 2.5 V, or 0 V, is applied to the sub control gate lines SCG, as shown in Table 2. The sub bit lines SBL in the non-selected cells in the selected sector region 0 are set to 0 V, since the select signal lines BLS are set to 8 V whereby the select transistors are turned ON.

In the non-selected cells in the non-selected sector region, 0 V is applied to both the sub control gate lines SCG and the main bit lines MBL, as shown in Table 3. Therefore, disturbance caused when a high potential similar to that at the time of programming is applied does not occur in the non-selected cells in the non-selected sector region.

A high potential is applied to the control gates in the non-selected cells in the selected sector region 0. However, such a high potential is applied only in the case where the programming is performed in the sector region 0. Therefore, frequency of the application of high potential is significantly decreased in comparison with the case where the high potential is applied to the non-selected cells in other sector regions each time programming is performed in one of the sector regions, whereby occurrence of disturbance can be prevented.

COMPARATIVE EXAMPLE

Figure 15:
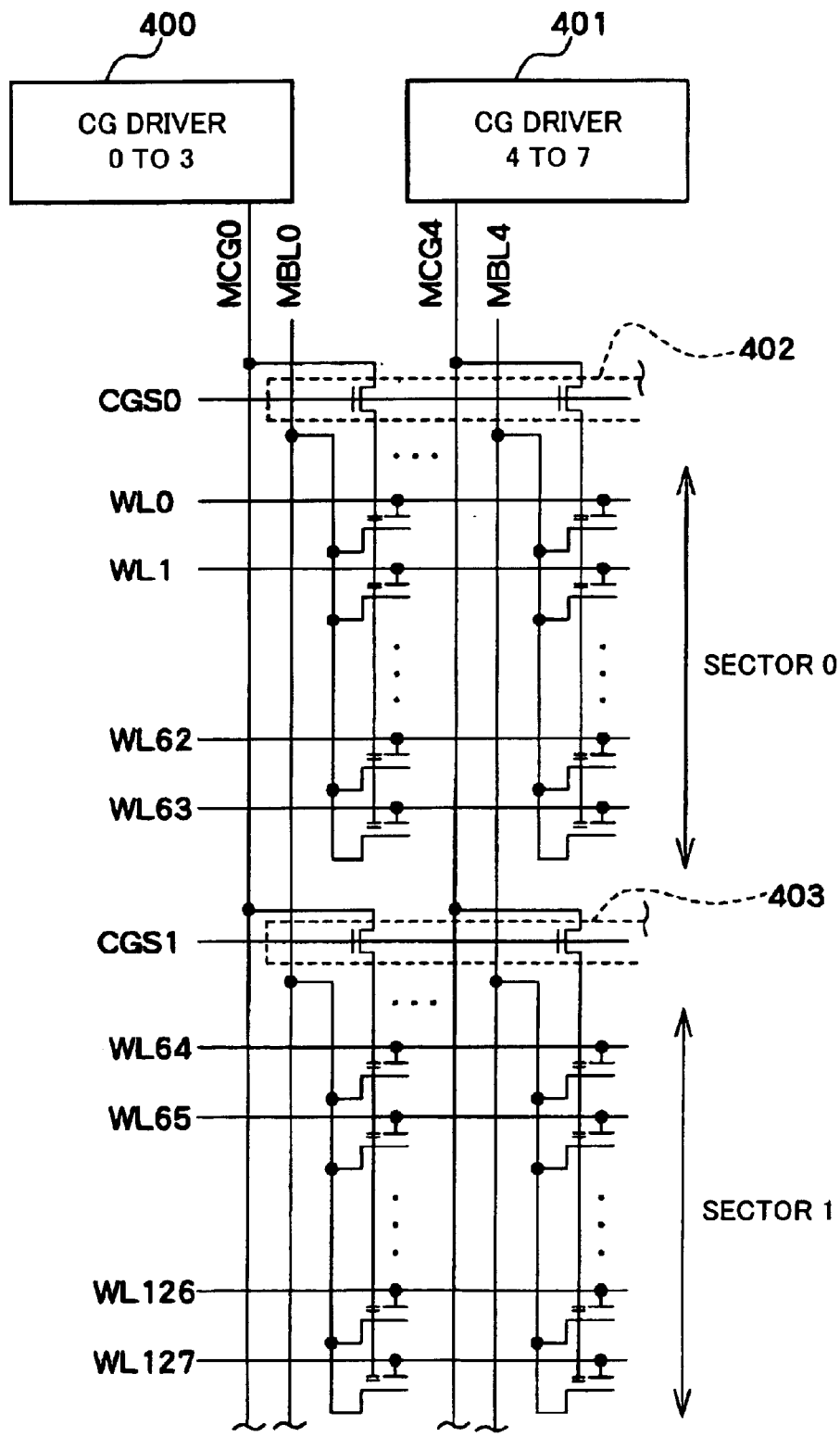
FIG. 15 is a circuit diagram showing the configuration of a comparative example for FIG. 9.

FIG. 15 shows a configuration of a comparative example. In this comparative example, the memory cell array region is divided in the column direction and has a plurality of sector regions 0, 1, . . . in which the column direction is the longitudinal direction. In the comparative example, CG drivers 400 and 401 are not formed corresponding to the sector regions 0 and 1, but are shared by the sector regions 0 and 1.

As shown in FIG. 15, a select gate region 402 and a select gate region 403 are formed corresponding to the sector region 0 and the sector region 1, respectively. N-type MOS transistors disposed in the select gate regions 402 and 403 select whether or not to supply the potential from the CG drivers 400 and 401 to the sector regions 0 and 1 based on the potential of the select signal lines CGS0 and CGS1.

In the comparative example, the potential may be set to substantially the same potential in the present embodiment shown in Tables 1 to 3. However, this can be attained by providing the select gate regions 402 and 403. If the select gate regions 402 and 403 are not provided, a high potential is also applied to the non-selected cells in the non-selected sector region 1 at the time of programming of the selected cell in the selected sector region 0. If the high potential at the time of programming is applied to the non-selected cells across the sector regions, the high potential is applied to the non-selected cells each time programming is performed, whereby disturbance occurs.

In the comparative example, it is indispensable to provide the select gate region for the control gates in each sector region in order to prevent the occurrence of disturbance.

In the comparative example, since the use of N-type MOS transistors in the select gate regions 402 and 403 causes a voltage drop to occur, a voltage for the voltage drop must be added to the necessary first high potential for erasure supplied from the CG drivers 400 and 401. This results in an increase in the voltage.

In the above-described embodiment of the present invention, the select gate region for applying a potential to the specific control gates can be omitted while preventing the occurrence of disturbance.

The present invention is not limited to the above-described embodiment. Various modifications and variations are possible without departing from the spirit and scope of the present invention.

For example, the structure of the non-volatile memory elements 108A and 108B is not limited to the MONOS structure. The present invention may be applied to a non-volatile semiconductor memory device using various types of other memory cells capable of independently trapping charges at two sites by one word gate 104 and first and second control gates 106A and 106B.

What is claimed is:

1. A non-volatile semiconductor memory device comprising:
   a memory cell array region in which are disposed a plurality of memory cells in first and second directions intersecting each other, each of the memory cells having first and second non-volatile memory elements that are controlled by one word gate and first and second control gates; and
   a control gate drive section which drives the first and second control gates of the memory cells within the memory cell array region,
   wherein the memory cell array region is divided in the second direction into a plurality of sector regions;
   wherein the control gate drive section has a plurality of control gate drivers each of which corresponds to one of the sector regions, and each of the control gate drivers is capable of setting a potential for the first and second control gates within the corresponding sector region, independently of other sector regions;
   wherein each of the sector regions is divided in the first direction into a plurality of block regions, and each of the block regions has a plurality of memory cells;
   wherein each of the block regions has a plurality of sub bit lines respectively connected to the memory cells and extending in the first direction;
   wherein a plurality of main bit lines are provided over the plurality of block regions extending in the first direction, and each of the main bit lines is commonly connected to the sub bit lines within the block regions; and
   wherein a plurality of switching elements which select connection/disconnection are provided at connections between the main bit lines and the sub bit lines.

2. The non-volatile semiconductor memory device as defined in claim 1,
   wherein each of the switching elements is provided at an end portion of each of the sub bit lines.

3. The non-volatile semiconductor memory device as defined in claim 2,
   wherein in each of the block regions, an odd-numbered switching element is connected to an end portion of an odd-numbered sub bit line on one side, and an even-numbered switching element is connected to an end portion of an even-numbered sub bit line on the opposite side, among the plurality of the sub bit lines.

4. The non-volatile semiconductor memory device as defined in claim 2,
   wherein in two of the block regions adjacent to each other in the first direction, when the switching elements in one block region are referred to as first switching elements and the switching elements in the other block region are referred to as second switching elements, the first and second switching elements commonly connected to one of the main bit lines are disposed to be adjacent to each other.

5. The non-volatile semiconductor memory device as defined in claim 4,
   wherein the first and second switching elements are field effect transistors which share an impurity layer.

6. The non-volatile semiconductor memory device as defined in claim 1,
   wherein the first and second control gates are disposed on either side of each of the sub bit lines, when one memory cell including the first control gate is adjacent to another memory cell including the second control gate in the second direction among the memory cells; and
   wherein end portions of the first and second control gates on both ends are respectively connected to form two continuous sections.

* * * * *